United States Patent
Lecue et al.

(10) Patent No.: US 11,093,856 B2
(45) Date of Patent: Aug. 17, 2021

(54) INTERPRETATION OF PREDICTIVE MODELS USING SEMANTIC GROUPING

(71) Applicant: Accenture Global Solutions Limited, Dublin (IE)

(72) Inventors: Freddy Lecue, Dublin (IE); Jiewen Wu, Dublin (IE); Ian Harris, Dublin (IE)

(73) Assignee: Accenture Global Solutions Limited, Dublin (IE)

( * ) Notice: Subject to any disclaimer, the term of this patent is extended or adjusted under 35 U.S.C. 154(b) by 1208 days.

(21) Appl. No.: 15/445,282

(22) Filed: Feb. 28, 2017

(65) Prior Publication Data

US 2018/0247209 A1 Aug. 30, 2018

(51) Int. Cl.
*G06N 20/00* (2019.01)
*G06N 5/04* (2006.01)
*G06F 30/20* (2020.01)
*G06N 20/20* (2019.01)
*G06F 40/30* (2020.01)
*G06K 9/62* (2006.01)
*G06N 5/02* (2006.01)

(52) U.S. Cl.
CPC ............. *G06N 20/00* (2019.01); *G06F 30/20* (2020.01); *G06F 40/30* (2020.01); *G06K 9/6228* (2013.01); *G06N 5/022* (2013.01); *G06N 5/045* (2013.01); *G06N 20/20* (2019.01)

(58) Field of Classification Search
CPC ........ G06N 20/00; G06N 20/10; G06N 20/20; G06N 5/02; G06N 5/022; G06N 5/045; G06F 40/30; G06F 30/20; G06K 9/6228

USPC .......................................................... 706/21
See application file for complete search history.

(56) References Cited

U.S. PATENT DOCUMENTS

| 2016/0224541 A1* | 8/2016 | Yakovlev | G06F 40/30 |
| 2016/0260033 A1* | 9/2016 | Keyngnaert | G06Q 10/063 |
| 2017/0160813 A1* | 6/2017 | Divakaran | G06N 20/10 |

FOREIGN PATENT DOCUMENTS

WO   WO-2016183229 A1 * 11/2016   ......... G06Q 30/0283

* cited by examiner

*Primary Examiner* — Shane D Woolwine
(74) *Attorney, Agent, or Firm* — Fish & Richardson P.C.

(57) ABSTRACT

Implementations are directed to receiving current data, processing the current data using a predictive model to provide a result, the result corresponding to a sub-model of the predictive model, determining a set of syntactically similar sub-models based on other data, providing at least one semantic model based on the sub-model of the predictive model, one or more syntactically similar sub-models of the set of syntactically similar sub-models, a domain ontology (knowledge graph), and constraints, the at least one semantic model being provided by merging nodes of the sub-model of the predictive model, and a previously determined sub-model of the predictive model using the domain ontology, a label of the domain ontology being used to label a merged node, determining an interpretation based on the at least one semantic model, the interpretation providing at least one reason for the result, and providing the interpretation.

27 Claims, 6 Drawing Sheets

INTERPRETATION OF PREDICTIVE MODELS USING SEMANTIC GROUPING

BACKGROUND

Predictive models are used in a variety of contexts to provide insight into processes. For example, predictive models are used to determine the probability of one or more outcomes of a process. In some examples, a predictive model is developed using a machine learning process, and is trained based on training data (e.g., historical data). Predictive models tend to be a black-box to users. For example, data is input to a predictive model, and the predictive model provides output based on the data. The predictive model, however, does not provide indication as to what resulted in the output.

SUMMARY

Implementations of the present disclosure are generally directed to interpretation of results of computer-executed predictive models using semantic grouping. In some implementations, actions include receiving current data, processing the current data using a predictive model to provide a result, the result corresponding to a sub-model of the predictive model, determining a set of syntactically similar sub-models based on data other than the current data, providing at least one semantic model based on the sub-model of the predictive model, one or more syntactically similar sub-models of the set of syntactically similar sub-models, a domain ontology stored as a knowledge graph, and one or more constraints, the at least one semantic model being provided by merging nodes of the sub-model of the predictive model, and a previously determined sub-model of the predictive model using the domain ontology, a label of the domain ontology being used to label a merged node, determining a human-readable interpretation based on the at least one semantic model, the human-readable interpretation providing at least one reason for the result, and providing the human-readable interpretation for display on a display of a computing device. Other implementations of this aspect include corresponding systems, apparatus, and computer programs, configured to perform the actions of the methods, encoded on computer storage devices.

These and other implementations can each optionally include one or more of the following features: determining a set of syntactically similar sub-models includes comparing nodes between the sub-model of the predictive model and each of one or more previously determined sub-models of the predictive model to provide respective similarity scores, at least one previously determined sub-model of the predictive model being included in the set of syntactically similar sub-models; the human-readable interpretation is determined based on the similarity scores; the domain ontology is specific to a domain of the predictive model; each constraint of the one or more constraints includes a constraint on a level of the domain ontology that can be used in the human-readable interpretation; actions further include receiving one or more user-defined constraints for inclusion in the one or more constraints; the at least one semantic model meets each constraint of the one or more constraints; prior to providing the at least one semantic model, at least one invalid semantic model is determined, the at least one invalid semantic model violating at least one constraint of the one or more constraints; and actions further include iteratively repeating providing a semantic model until at least one constraint of the one or more constraints is satisfied.

Implementations of the present disclosure provide one or more of the following advantages. For example, implementations of the present disclosure provide a human-readable interpretation of a result of a predictive model. In this manner, transparency to the predictive model, and the result is provided, moving the predictive model from the realm of black box.

The present disclosure also provides a computer-readable storage medium coupled to one or more processors and having instructions stored thereon which, when executed by the one or more processors, cause the one or more processors to perform operations in accordance with implementations of the methods provided herein.

The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

It is appreciated that methods in accordance with the present disclosure can include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

DETAILED DESCRIPTION

Implementations of the present disclosure are generally directed to interpreting a predictive model based on semantic grouping. More particularly, implementations of the present disclosure are directed to continuous interpretation of a predictive model by systematically injecting semantics. In some examples, and as introduced above, a predictive model provides at least one result (e.g., a value), which can be described as a class of the input provided to the predictive model. Implementations of the present disclosure provide an interpretation of the at least one result. In some implementations, the interpretation indicates reasons for the respective result.

Implementations include actions of receiving current data, processing the current data using a predictive model to provide a result, the result corresponding to a sub-model of the predictive model, determining a set of syntactically similar sub-models based on data other than the current data, providing at least one semantic model based on the sub-model of the predictive model, one or more syntactically similar sub-models of the set of syntactically similar sub-models, a domain ontology stored as a knowledge graph, and one or more constraints, the at least one semantic model being provided by merging nodes of the sub-model of the predictive model, and a previously determined sub-model of the predictive model using the domain ontology, a label of the domain ontology being used to label a merged node, determining a human-readable interpretation based on the at least one semantic model, the human-readable interpretation providing at least one reason for the result, and providing the human-readable interpretation for display on a display of a computing device.

Implementations of the present disclosure will be described in further detail herein with reference to an example context. The example context includes providing interpretations of predictive model results including likelihood of failure of robot-mounted, welding torches. It is contemplated, however, that implementations of the present disclosure can be realized in any appropriate context.

Figure 1:
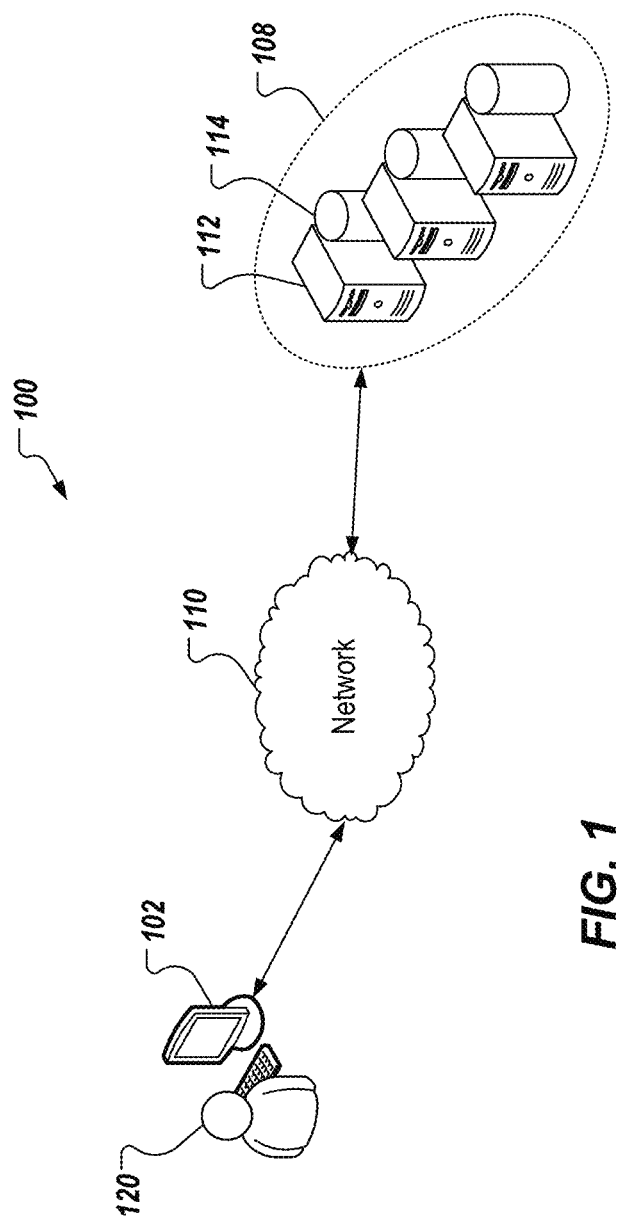
FIG. 1 depicts an example system that can execute implementations of the present disclosure.

FIG. 1 depicts an example system 100 that can execute implementations of the present disclosure. The example system 100 includes a computing device 102, a back-end system 108, and a network 110. In some examples, the network 110 includes a local area network (LAN), wide area network (WAN), the Internet, or a combination thereof, and connects web sites, devices (e.g., the computing device 102), and back-end systems (e.g., the back-end system 108). In some examples, the network 110 can be accessed over a wired and/or a wireless communications link. For example, mobile computing devices, such as smartphones can utilize a cellular network to access the network 110.

In the depicted example, the back-end system 108 includes at least one server system 112, and data store 114 (e.g., database and knowledge graph structure). In some examples, the at least one server system 112 hosts one or more computer-implemented services that users can interact with using computing devices. For example, the server system 112 can host a computer-implemented service for executing predictive models, and interpreting results of predictive models in accordance with implementations of the present disclosure.

In some examples, the computing device 102 can include any appropriate type of computing device such as a desktop computer, a laptop computer, a handheld computer, a tablet computer, a personal digital assistant (PDA), a cellular telephone, a network appliance, a camera, a smart phone, an enhanced general packet radio service (EGPRS) mobile phone, a media player, a navigation device, an email device, a game console, or an appropriate combination of any two or more of these devices or other data processing devices.

As introduced above, implementations of the present disclosure are directed to interpreting a predictive model based on semantic grouping. In some implementations, and as described in further detail herein, a predictive model and its underlying training data are provided, as well as a domain ontology. One or more constraints can also be provided. In some examples, the domain ontology corresponds to a particular domain (e.g., robot-mounted welding torches) of the predictive model. In some implementations, a semantic model is provided based on the syntactically similar models, and the domain ontology. The semantic model is used to interpret one or more reasons, as to why the predictive model provided a particular result. For example, current data can be processed through the predictive model to provide a result. An example result can include a probability (e.g., likelihood) of an event (e.g., 70% that failure of a robotic arm is imminent). In accordance with implementations of the present disclosure, a human-readable interpretation of the result is provided, which indicates one or more reasons that led to the result (e.g., model designed in Europe, and number of pull actions is greater than 1.5 M).

As described in further detail herein, implementations of the present disclosure include syntactic matching, semantic merging, consistency checking, and interpretation generation. In some examples, syntactic matching includes comparing predictive models (e.g., sub-models of predictive models) based on syntax, and providing a set of syntactically similar models. Semantic merging includes merging models in the set of syntactically similar models based on the domain ontology to provide the semantic model. The semantic model can be described as an abstraction of models provided in the set of semantically similar models. Consistency checking can include checking the semantic model against one or more constraints. In some examples, if the semantic model violates a constraint, the semantic model is rejected, and a revised semantic model is provided, as described in detail herein. Once a valid semantic model (e.g., a semantic model that does not violate constraints, if any) is provided, the semantic model is used to provide an interpretation as to why the predictive model provided a particular result based on the current data.

In some implementations, the domain ontology is provided as a knowledge graph, or a portion of a knowledge graph. In some examples, a knowledge graph is a collection of data and related based on a schema representing entities and relationships between entities. The data can be logically described as a graph (even though also provided in table form), in which each distinct entity is represented by a respective node, and each relationship between a pair of entities is represented by an edge between the nodes. Each edge is associated with a relationship and the existence of the edge represents that the associated relationship exists between the nodes connected by the edge. For example, if a node A represents a person Alpha, a node B represents a person Beta, and an edge E is associated with the relationship "is the father of," then having the edge E connect the nodes in the direction from node A to node B in the graph represents the fact that Alpha is the father of Beta. In some examples, the knowledge graph can be enlarged with schema-related knowledge (e.g., Alpha is a concept Person, Beta is a concept Person, and "is the father of" is a property or relationship between two entities/instances of concept Person). Adding schema-related information supports evaluation of reasoning results.

A knowledge graph can be represented by any of a variety of physical data structures. For example, a knowledge graph can be represented by triples that each represent two entities in order, and a relationship from the first to the second entity; for example, [alpha, beta, is the father of], or [alpha, is the father of, beta], are alternative ways of representing the same fact. Each entity and each relationship can be, and generally will be, included in multiple triples.

In some examples, each entity can be stored as a node once, as a record or an object, for example, and linked through a linked list data structure to all the relationships the entity has, and all the other entities to which the entity is related. More specifically, a knowledge graph can be stored as an adjacency list in which the adjacency information includes relationship information. In some examples, each distinct entity and each distinct relationship are represented with respective, unique identifiers.

The entities represented by a knowledge graph need not be tangible things or specific people. The entities can include particular people, places, things, artistic works, concepts, events, or other types of entities. Thus, a knowledge graph can include data defining relationships between people (e.g., co-stars in a movie); data defining relationships between people and things (e.g., a particular singer recorded a particular song); data defining relationships between places and things (e.g., a particular type of wine comes from a particular geographic location); data defining relationships between people and places (e.g., a particular person was born in a particular city); and other kinds of relationships between entities.

In some implementations, each node has a type based on the kind of entity the node represents; and the types can each have a schema specifying the kinds of data that can be maintained about entities represented by nodes of the type and how the data should be stored. For example, a node of a type for representing a person could have a schema defining fields for information such as birth date, birth place, and so on. Such information can be represented by fields in a type-specific data structure, or by triples that look like node-relationship-node triples (e.g., [person identifier, was born on, date]), or in any other convenient predefined way. In some examples, some or all of the information specified by a type schema can be represented by links to nodes in the knowledge graph; for example, [one person identifier, child of, another person identifier], where the other person identifier is a node in the graph.

In accordance with the example context, and as described in further detail herein, a knowledge graph can be provided as a collection of data and a schema representing subjects and relationships between subjects, and/or features of subjects. For example, a knowledge graph, or at least a portion thereof, can be provided as a collection of data representing, in accordance with the example context, models of robots, robot arms, movement of robotic arms, manufacturers of robots, and the like (e.g., as discussed in further detail herein with reference to FIG. 4).

Figure 2:
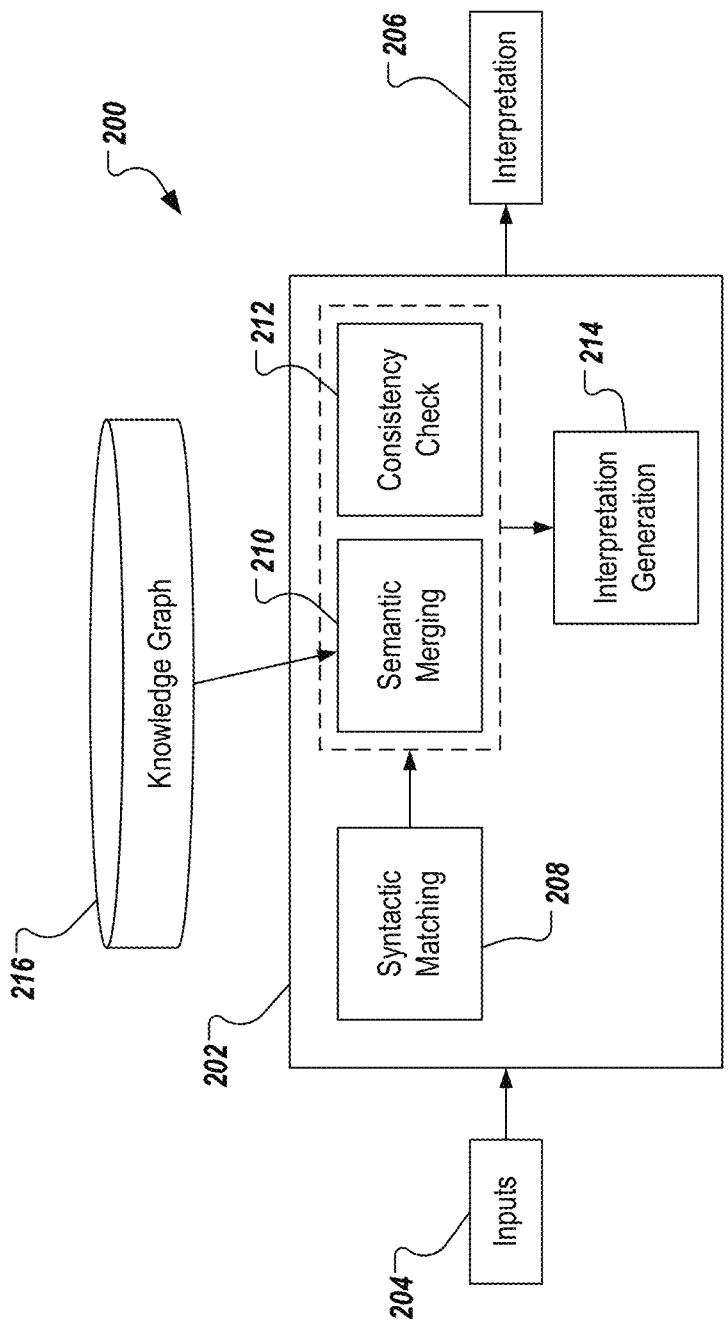
FIG. 2 depicts an example module architecture in accordance with implementations of the present disclosure.

FIG. 2 depicts an example module architecture 200 in accordance with implementations of the present disclosure. The example module architecture 200 includes an interpretation module 202 that receives one or more inputs 204 to provide an interpretation 206 describing one or more reasons underlying a particular result provided by a predictive model. In the depicted example, the interpretation module 202 includes a syntactic matching sub-module 208, a semantic merging sub-module 210, a consistency checking sub-module 212, and an interpretation generation sub-module 214. The example module architecture 200 also includes a data store 216 (e.g., database). In some examples, each of the modules and/or sub-modules is provided as one or more computer-executable programs executed by one or more computing devices (e.g., of the back-end system 108 of FIG. 1).

In some implementations, the inputs 204 include a predictive model, training data (e.g., data used to train the predictive model), one or more ontologies, one or more taxonomies (e.g., provided as at least portion of a knowledge graph), one or more constraints, and current data that is to be processed using the predictive model, and for which an interpretation is to be provided. In some examples, the inputs 204 can also include a syntactic interoperability score ($S_{SYN}$), and a semantic interoperability score ($S_{SEM}$).

In some implementations, the predictive model is provided as a random forest model. A random forest model can be described as a random decision forest that is an ensemble learning method for classification, and regression. In some examples, the random forest model operates by constructing a multitude of decision trees at training time, and outputting the class that is the mode of the classes (classification), or mean prediction (regression) of the individual trees. Accordingly, multiple individual classifiers are included in the model, each of which can provide a respective path. For example, a path $P_1$ can be a path through the predictive model that a first classifier provides based on given input data, a path $P_2$ can be a path that a second classifier provides based on the given input data, and so on. Consequently, for a given input data, a set of paths (e.g., $P_1, \ldots, P_n$) can be provided (e.g., one path from each of n classifiers included in the predictive model).

Figure 3:
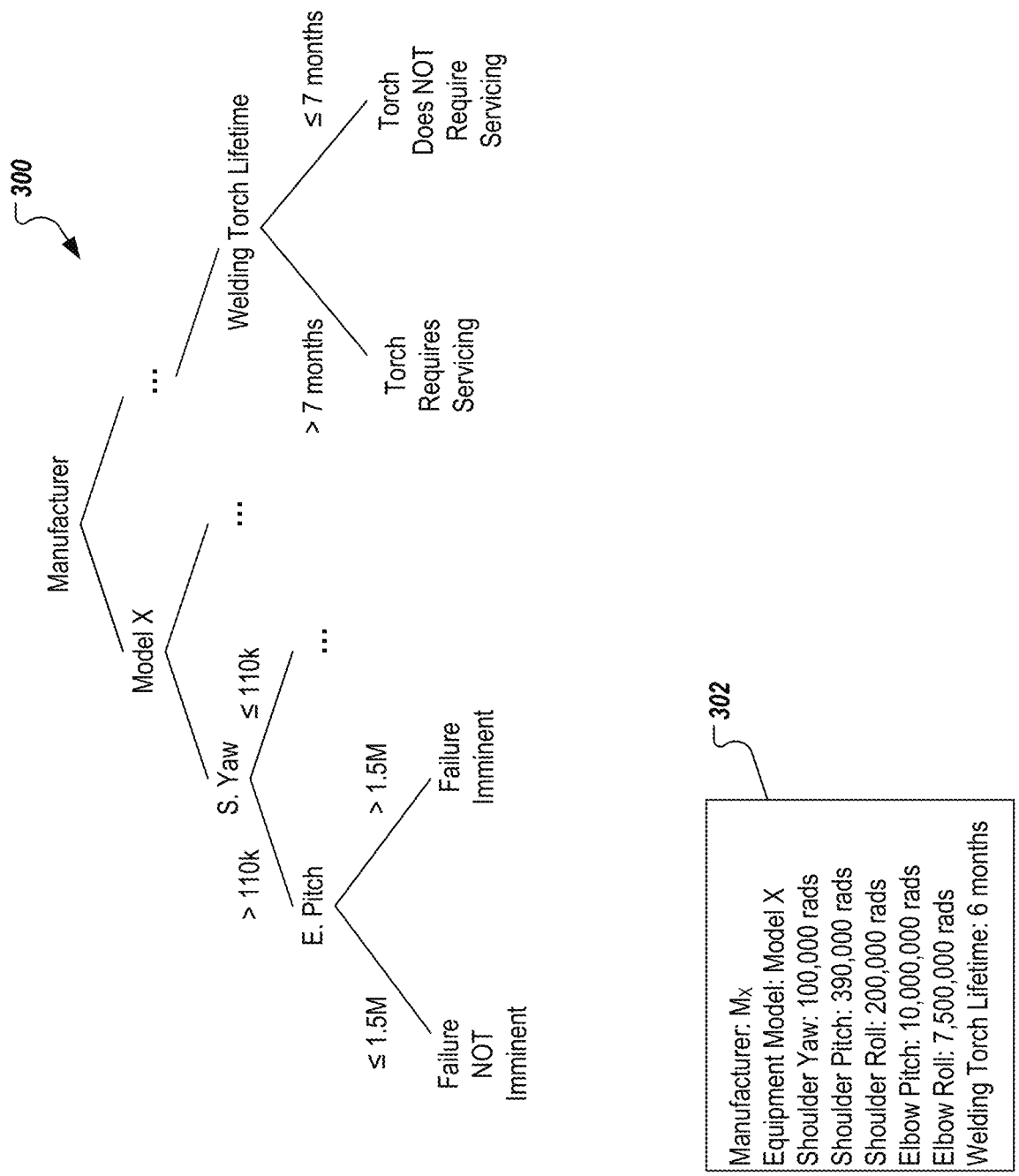
FIG. 3 depicts an example predictive model and respective training data.

FIG. 3 depicts an example predictive model 300 and respective training data 302. The example predictive model 300 and the example training data 302 are examples of the input 204 to the interpretation module 204. In the depicted example, the predictive model 300 is provided as a tree structure. For example, a root node is provided, as well as a plurality of intermediate nodes, and leaf nodes. The predictive model 300 corresponds to the example context, and models robot arm failure, and welding torch maintenance. In some examples, a trace can be made from root node to leaf node based on data, the leaf node providing output (a result) of the predictive model. In the depicted example, the predictive model 300 provides that, for a Model X robot having a welding torch, failure of the robot arm is imminent, if the shoulder yaw (S. Yaw) radians (rads) are less than 110,000 (110 k) rads, and the elbow pitch (E. Pitch) rads are greater than 1,500,000 (1.5 M) rads. That is, if the shoulder yaw has accumulated less than 110 k rads, and the elbow pitch has accumulated more than 1.5 M rads, failure of the robot arm for the Model X robot is imminent. In the depicted example, the predictive model 300 also provides that, if the welding torch lifetime is greater than 7 months, the welding torch requires servicing.

In the example of FIG. 3, only a portion of the predictive model 300 is displayed. In some examples, to land at a particular leaf node (e.g., failure imminent), multiple conditions can be checked at respective intermediate nodes (e.g., S. Yaw and E. Pitch, as depicted). The predictive model 300, however, can also account for other conditions. For example, and although not depicted in FIG. 3, the predictive model 300 can provide that failure is imminent, if the shoulder yaw is greater than or equal to 110 k, and the shoulder pitch (S. Pitch) rads are greater than some threshold (e.g., 450 k rads).

In some implementations, the syntactic matching sub-module 208 performs syntactic matching between the training data, and the current data based on the predictive model. An example of syntactic matching will be described with reference to the example predictive model 300, and the example training data 302 of FIG. 3, in view of the following example current data:

Manufacturer: $M_Y$
Equipment Model: Model Y
Shoulder Yaw: 10,000 rads
Shoulder Pitch: 31,000 rads
Shoulder Roll: 1,500,000 rads
Elbow Pitch: 140,000 rads
Welding Torch Lifetime: 6 months Accordingly, the above-provided example current data is the data, for which a result of the predictive model is to be provided, and for which an interpretation of the result is to be provided.

In accordance with implementations of the present disclosure, the syntactic matching sub-module 208 compares the training data and the current data in view of the predictive model to provide a set of syntactically similar models. In some examples, each model in the set of syntactically similar models is provided based on respective data (e.g., the training data, the current data), and includes a sub-model within the predictive model. For example, a predictive model can include a plurality of sub-models therein, each sub-model including a path (trace) through the predictive module (e.g., a path from root node to leaf node). In some implementations, syntactic matching includes tracing and comparing paths (sub-models) through the tree structure of the predictive model. In some examples, syntactic matching includes single paths (e.g., from root node to leaf nodes), and return paths (e.g., from leaf nodes to root node). In some examples, the single path includes a pairwise comparison of nodes being performed for every condition in the tree.

With reference to the example predictive model 300, and the example training data 302 of FIG. 3, in view of the above-provided example current data, it can be determined that the root node (i.e., "manufacturer"), the S. Yaw intermediate node, the E. Pitch intermediate node, and the welding torch lifetime intermediate node are each implicated by both the training data 302, and the above-provided current data. More particularly, a first trace ($P_1$) can be traced through the predictive model 300 based on the current data, and can include nodes→[Manufacturer, S. Yaw, E. Pitch], and a second trace ($P_2$) can be traced through the predictive model 300 based on the training data 302, and can include nodes→[Manufacturer, Model X, S. Yaw, E. Pitch]. Other traces can be traced through the predictive model 300 (e.g., using other sets of training data). A set of traces (e.g., $P \rightarrow \{P_1, P_2, \ldots, P_n\}$). In some examples, the first trace (e.g., based on the current data) can be compared to each of the other traces (e.g., based on respective classifiers) to determine a syntactic similarity between the first traces, and each of the other traces.

In some implementations, syntactic similarity is determined based on respective labels of nodes. For example, a node-to-node comparison can be performed between nodes of the compared traces, and the number of similar nodes with respect to the overall number of nodes can be determined. The above-described first trace ($P_1$) and second trace ($P_2$) are referenced as an example, and a comparison is provided in the table below:

| $P_1$ | $P_2$ | Syntactically Similar |
|---|---|---|
| Manufacturer | Manufacturer | Yes |
| Model Y | Model X | No |
| S. Yaw | S. Yaw | Yes |
| E. Pitch | E. Pitch | Yes |

In some examples, a syntactic similarity score (also referred to as syntactic interoperability score) can be determined as between traces (models). In the above example, it can be determined that the first trace ($P_1$) and the second trace ($P_2$) have a syntactic similarity score of 0.75 (e.g., 75% overlap in nodes). Accordingly, the first trace ($P_1$) (e.g., provided based on the current data) can be compared to each of the other traces (e.g., $P_2, \ldots, P_n$), and respective syntactic similarity scores can be provided (e.g., $s_{1,2}, \ldots, s_{1,n}$). In some examples, each syntactic similarity score is compared to a threshold syntactic similarity score. If a syntactic similarity score exceeds the threshold syntactic similarity score, the respective traces is included in a set of syntactically similar models (e.g., $\{P_1, P_2, P_6, P_8\}$).

Figure 4:
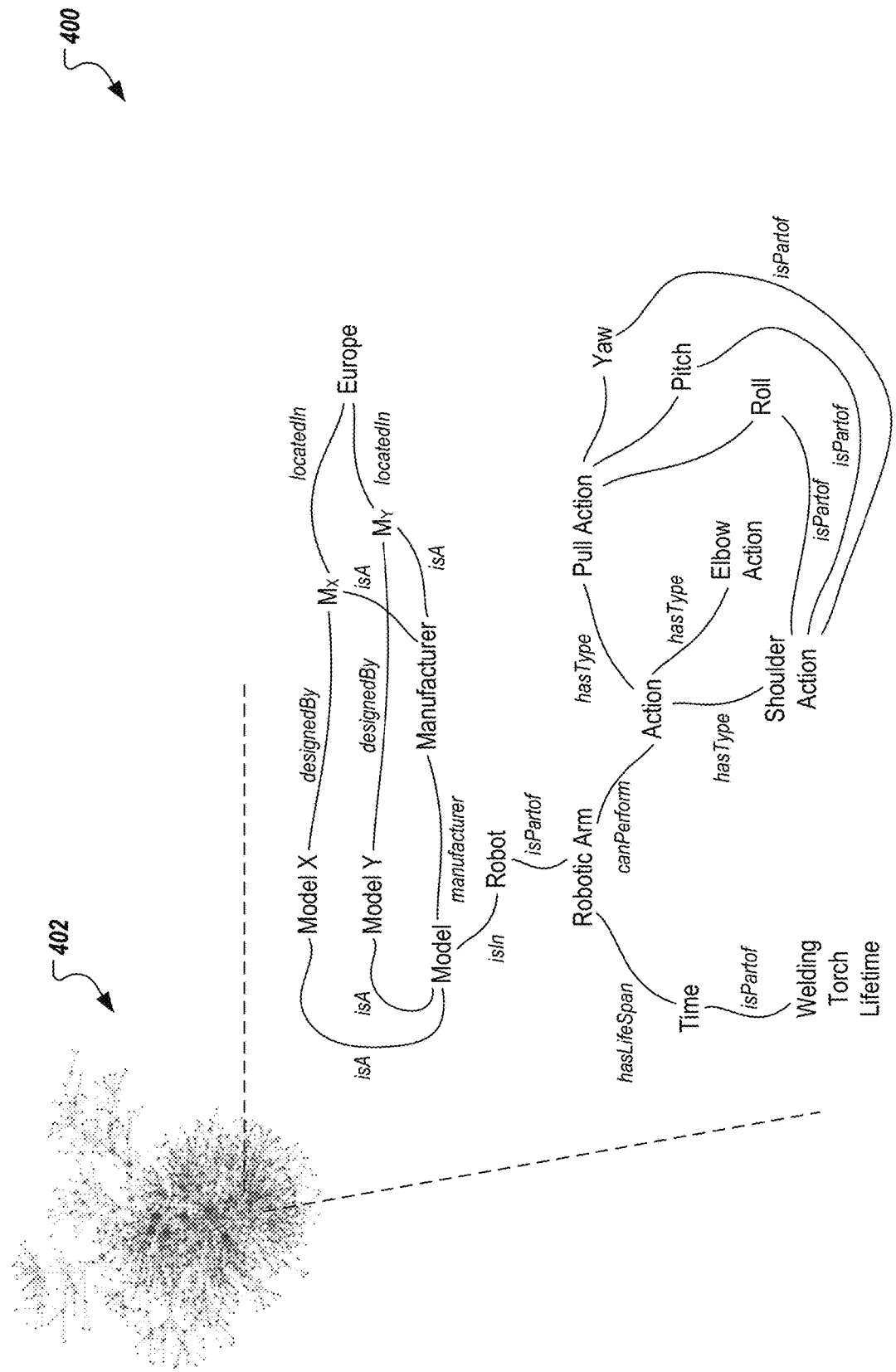
FIG. 4 depicts an example portion of an example knowledge graph.

The set of syntactically similar models is provided as input to the semantic merging sub-module 210. As described in further detail herein, the semantic merging sub-module 210 provides a semantic model based on the set of syntactically similar models, and the domain ontology. In some examples, the domain ontology is used to abstract nodes of the respective models. As introduced above, the domain ontology can be provided as a knowledge graph (e.g., stored in the data store 216 of FIG. 2). FIG. 4 depicts an example portion 400 of an example knowledge graph 402 in accordance with the example context.

In accordance with implementations of the present disclosure, two or more semantically similar models of the set of semantically similar models are merged using the domain ontology to provide a semantic model. In some implementations, a semantic similarity score (also referred to as a semantic interoperability score) can be determined as between traces (models). In some examples, each semantic similarity score is compared to a threshold semantic similarity score. If a semantic similarity score exceeds the threshold semantic similarity score, the respective traces are included in a set of semantically similar models, which can be semantically merged.

Figure 5:
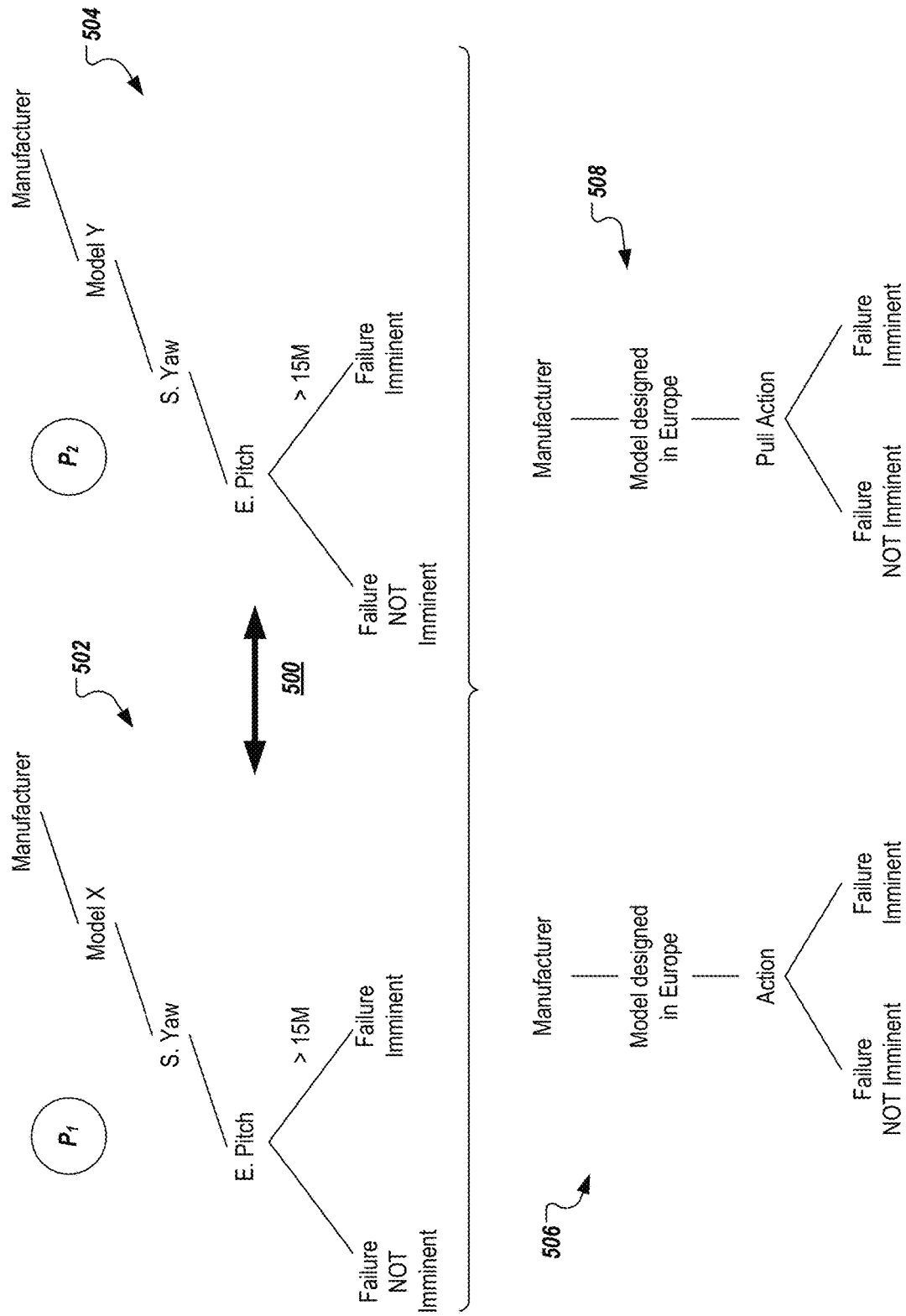
FIG. 5 depicts an example merging to provide semantic models in accordance with implementations of the present disclosure.

FIG. 5 depicts an example merging 500 of sub-models 502, 504 to provide semantic models 506, 508. The example of FIG. 5 corresponds to the example models $P_1$, $P_2$, described above, and the example portion 400 of the example knowledge graph 402 of FIG. 4. In some implementations, for each pair of nodes (e.g., a pair including a node from $P_1$, and a node from $P_2$), a corresponding node of the domain ontology is identified. In some examples, beginning with root nodes, a pairwise comparison of nodes is made at each level of the sub-models. In the example of FIG. 5, the root nodes "manufacturer" of $P_1$ and $P_2$ are each compared to the domain ontology of FIG. 4, and it is determined that "manufacturer" is the highest level of abstraction for both of the root nodes. Consequently, a root node "manufacturer" is included in the semantic model 506. One level below the root nodes, the intermediate nodes "Model X" of $P_1$ and "Model Y" of $P_2$ are each compared to the domain ontology of FIG. 4, and it is determined that, at the highest level of common abstraction, each is a model designed in Europe. Consequently, an intermediate node "Model designed in Europe" is included in the semantic model 506. Continuing, the intermediate nodes "S. Yaw" and "E. Pitch" of $P_1$ and $P_2$ can be compared, and it is determined that, at the highest level of common abstraction, each is included in "Action." Consequently, an intermediate node "Action" is included in the semantic model 506. In some examples, both "S. Yaw" and "E. Pitch" can be abstracted to "Action." Consequently, a single intermediate node "Action" is provided. As leaf nodes, the semantic model 506 includes the leaf nodes of each of $P_1$ and $P_2$, namely "Failure NOT Imminent," and "Failure Imminent."

In accordance with implementations of the present disclosure, the semantic model 506 is checked for consistency by the consistency checking sub-module 212. More particularly, the consistency checking sub-module 212 compares the semantic model 506 to the one or more constraints provided in the inputs 204. Each constraint constrains the level of generalization (abstraction) that is permitted in the semantic model that is to be used to determine the interpretation. In the example context, example constraints can include:

Manufacturer AND hasModel.(haslocation.Europe) AND hasAction.(Action) is forbidden The example constraint constrains the abstraction of the semantic model to include manufacturers having models that are designed in Europe, and the action cannot be generalized to Action (i.e., the action, if any, has to be more specific than Action).

Continuing with the above example, and with continued reference to FIG. 5, the semantic model 506 can be compared to the example constraints, and it can be determined that the semantic model 506 is invalid with respect to the constraints. More particularly, although the semantic model 506 meets the constraints Manufacturer AND hasModel.(haslocation.Europe), the semantic model 506 violates the constraint has Action.(Action) is forbidden. Consequently, it is determined that the semantic model 506 is invalid.

In response to the semantic model 506 being invalid, the semantic merging sub-module 210 determines another semantic model, which is less generalized than the previous semantic model (i.e., the semantic model 506). Accordingly, the semantic merging sub-module 210 can process $P_1$ and $P_2$ in view of the domain ontology, as described above. However, when processing the intermediate nodes "S. Yaw" and "E. Pitch," these are generalized to "Pull Action" to provide the semantic model 508. In this manner, the semantic model 508 is more specific than the semantic model 506.

The semantic model 508 can be compared to the example constraints, and it can be determined that the semantic model 508 is valid with respect to the constraints. More particularly, the semantic model 508 meets the constraints Manufacturer AND hasModel.(haslocation.Europe), as well as the constraint has Action.(Action) is forbidden. Consequently, it is determined that the semantic model 508 is valid.

In view of the above, determining a valid semantic model can be an iterative process. Although a single iteration is described in the example above, it is contemplated that determining a valid semantic model can include multiple iterations.

In response to determining that a semantic model is valid, the semantic model is provided to the interpretation generation sub-module 214. In some implementations, the semantic model is processed to determine features that influenced the result, as well as why the semantic model was determined to be valid in view of any applied constraint(s). In some examples, the semantic model can be compared to another semantic model that provided a different result. In the example context, another semantic model that provided a different result can include Manufacturer—Model designed in USA—Elbow Action. In some examples, nodes of the semantic models can be compared, and nodes that are semantically similar (e.g., the same) are identified as features that did not influence the result provided by the current data, and nodes that are semantically dissimilar (e.g., different) are identified as features that influenced the result. The following example table provides an example comparison based on the example semantic model 508, and the example other semantic model:

| Other Semantic Model | Semantic Model 508 | Influence? |
|---|---|---|
| Manufacturer | Manufacturer | No |
| Model designed in USA | Mode designed in Europe | Yes |
| Elbow Action | Pull Action | Yes |

Accordingly, it can be determined that "Manufacturer" is not a feature that influenced the result. That is, because both the semantic model 508 and the other semantic model include "Manufacturer," this feature could not have influenced the different results. It can be determined, however, that the features "Model designed in Europe," and "Pull Action" are features that influenced the result provided by the semantic model 508. That is, because the semantic model 508 includes "Model designed in Europe" and "Pull Action," but the other semantic model does not, these features can have influenced the different results. Consequently, an example interpretation can include "Model designed in Europe and pull actions is greater than or equal to 1.5 M."

In some implementations, the current data is processed through the predictive model to provide one or more results, and an interpretation is provided for at least one result. For example, current data can be processed through the predictive model and a result can include a probability (likelihood) of an event, and a corresponding interpretation is provided. Continuing with the examples above, an example result can provide that there is a 70% probability that failure of the robotic arm is imminent, because the model of the robot was designed in Europe, and the pull action count is greater than or equal to 1.5 M.

Figure 6:
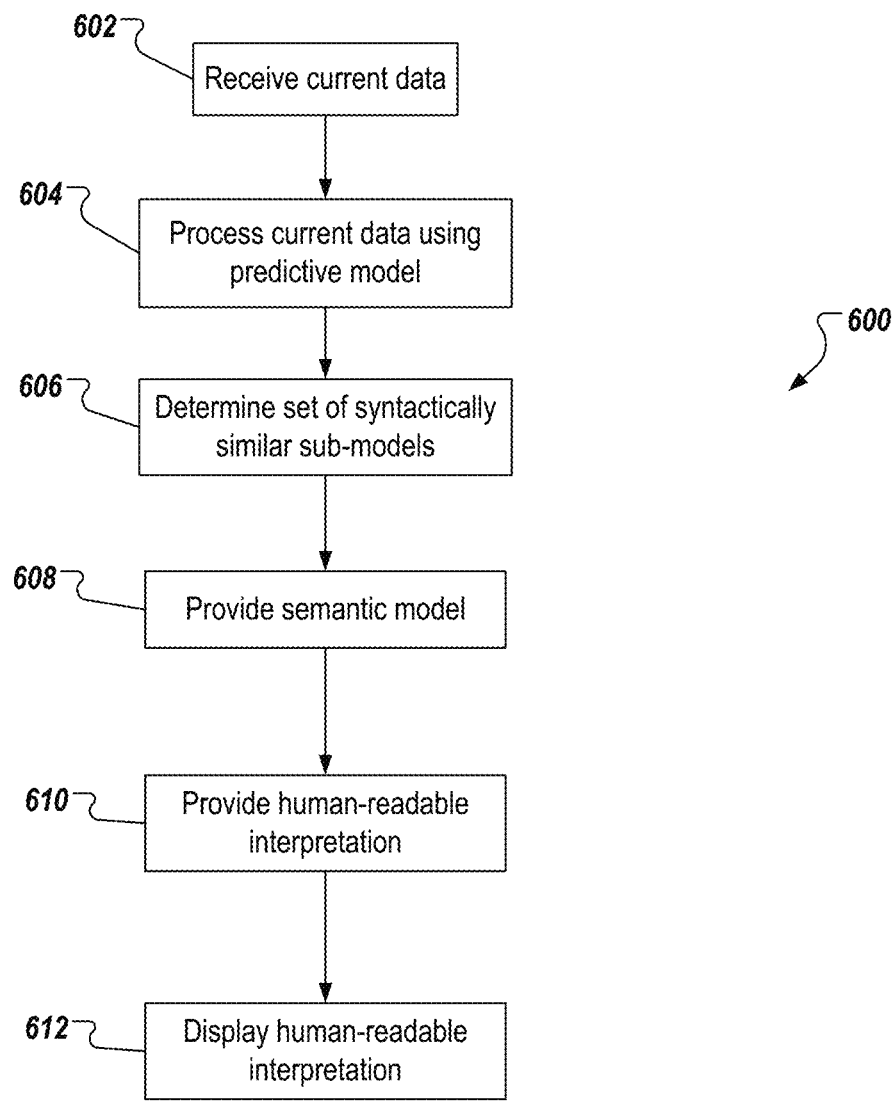
FIG. 6 depicts an example processes that can be executed in implementations of the present disclosure.

FIG. 6 depicts an example process 600 that can be executed in implementations of the present disclosure. In some examples, the example process 600 is provided using one or more computer-executable programs executed by one or more computing devices (e.g., the back-end system 108 of FIG. 1). The example process 600 can be executed to provide interpretation of a predictive model, as described herein.

Current data is received (602). For example, a user (e.g., the user 120 of FIG. 1) can submit current data to be processed (e.g., by the back-end system 108 of FIG. 1). In some examples, current data can be automatically, and/or continuously submitted to be processed (e.g., without user intervention). The current data is processed using a predictive model to provide a result (604). For example, at least one path can be traced through the predictive model based on the current data to provide the result (e.g., by comparing current data to rules provided at intermediate nodes to move to the next level node). The result corresponds to a sub-model (trace, path) of the predictive model.

A set of syntactically similar models is determined (606). For example, training data used to train the predictive model can be used to provide a set of models, and each model in the set of models can be compared to the model provided by the current data to determine syntactic similarity therebetween, as described in detail above. Each model that is determined to be sufficiently syntactically similar to the model provided from the training data is included in the set of syntactically similar models. Accordingly, the set of syntactically similar models is determined based on data other than the current data.

At least one semantic model is provided (608). For example, and as described in detail herein, the at least one semantic models is provided based on the model resulting from the current data, one or more syntactically similar models of the set of syntactically similar models, and a domain ontology. The domain ontology is stored as a knowledge graph. As also described herein, the semantic model is provided based on one or more constraints (e.g., through an iteration of semantic model generation and constraint checking to ensure the semantic model is valid).

A human-readable interpretation is provided (610). For example, and as described herein, the interpretation is provided based on the at least one semantic model, and other semantic models (e.g., semantic models providing a different result). The human-readable interpretation provides at least one reason for the result that the predictive model provided based on the current data. The human-readable interpretation is provided for display on a display of a computing device (612). In some examples, the interpretation is provided for display with the results (e.g., there is a 70% probability that failure of the robotic arm is imminent, because the model of the robot was designed in Europe, and the pull action count is greater than or equal to 1.5 M.).

Implementations and all of the functional operations described in this specification may be realized in digital electronic circuitry, or in computer software, firmware, or hardware, including the structures disclosed in this specification and their structural equivalents, or in combinations of one or more of them. Implementations may be realized as one or more computer program products, i.e., one or more modules of computer program instructions encoded on a computer readable medium for execution by, or to control the operation of, data processing apparatus. The computer readable medium may be a machine-readable storage device, a machine-readable storage substrate, a memory device, a composition of matter effecting a machine-readable propagated signal, or a combination of one or more of them. The term "computing system" encompasses all apparatus, devices, and machines for processing data, including by way of example a programmable processor, a computer, or multiple processors or computers. The apparatus may include, in addition to hardware, code that creates an execution environment for the computer program in question (e.g., code) that constitutes processor firmware, a protocol stack, a database management system, an operating system, or a combination of one or more of them. A propagated signal is an artificially generated signal (e.g., a machine-generated electrical, optical, or electromagnetic signal) that is generated to encode information for transmission to suitable receiver apparatus.

A computer program (also known as a program, software, software application, script, or code) may be written in any appropriate form of programming language, including compiled or interpreted languages, and it may be deployed in any appropriate form, including as a stand alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry (e.g., an FPGA (field programmable gate array) or an ASIC (application specific integrated circuit)).

Processors suitable for the execution of a computer program include, by way of example, both general and special purpose microprocessors, and any one or more processors of any appropriate kind of digital computer. Generally, a processor will receive instructions and data from a read only memory or a random access memory or both. Elements of a computer can include a processor for performing instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks). However, a computer need not have such devices. Moreover, a computer may be embedded in another device (e.g., a mobile telephone, a personal digital assistant (PDA), a mobile audio player, a Global Positioning System (GPS) receiver). Computer readable media suitable for storing computer program instructions and data include all forms of non-volatile memory, media and memory devices, including by way of example semiconductor memory devices (e.g., EPROM, EEPROM, and flash memory devices); magnetic disks (e.g., internal hard disks or removable disks); magneto optical disks; and CD ROM and DVD-ROM disks. The processor and the memory may be supplemented by, or incorporated in, special purpose logic circuitry.

To provide for interaction with a user, implementations may be realized on a computer having a display device (e.g., a CRT (cathode ray tube), LCD (liquid crystal display), LED (light-emitting diode) monitor, for displaying information to the user and a keyboard and a pointing device (e.g., a mouse or a trackball), by which the user may provide input to the computer. Other kinds of devices may be used to provide for interaction with a user as well; for example, feedback provided to the user may be any appropriate form of sensory feedback (e.g., visual feedback, auditory feedback, or tactile feedback); and input from the user may be received in any appropriate form, including acoustic, speech, or tactile input.

Implementations may be realized in a computing system that includes a back end component (e.g., as a data server), or that includes a middleware component (e.g., an application server), or that includes a front end component (e.g., a client computer having a graphical user interface or a Web browser through which a user may interact with an implementation), or any appropriate combination of one or more such back end, middleware, or front end components. The components of the system may be interconnected by any appropriate form or medium of digital data communication (e.g., a communication network). Examples of communication networks include a local area network ("LAN") and a wide area network ("WAN") (e.g., the Internet).

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

What is claimed is:

1. A computer-implemented method for interpreting a result of a computer-executed predictive model, the method being executed by one or more processors and comprising:
   receiving, by the one or more processors, current data;
   processing, by the one or more processors, the current data using a predictive model to provide a result, the result corresponding to a sub-model of the predictive model;
   determining, by the one or more processors, a set of syntactically similar sub-models based on data other than the current data, the set of syntactically similar sub-models being determined by syntactic matching between the current data and the data other than the current data based on the predictive model, syntactic matching comprising tracing multiple paths through the predictive model and syntactically matching a first trace provided based on the current data to a second trace provided based on at least a portion of the data other than the current data;
   providing, by the one or more processors, at least one semantic model based on the sub-model of the predictive model, one or more syntactically similar sub-models of the set of syntactically similar sub-models, a domain ontology stored as a knowledge graph, and one or more constraints, the at least one semantic model being provided by merging nodes of the sub-model of the predictive model, and a previously determined sub-model of the predictive model using the domain ontology, a label of the domain ontology being used to label a merged node;
   determining, by the one or more processors, a human-readable interpretation based on the at least one semantic model, the human-readable interpretation providing at least one reason for the result; and providing, by the one or more processors, the human-readable interpretation for display on a display of a computing device.

2. The method of claim 1, wherein determining a set of syntactically similar sub-models comprises comparing nodes between the sub-model of the predictive model and each of one or more previously determined sub-models of the predictive model to provide respective similarity scores, at least one previously determined sub-model of the predictive model being included in the set of syntactically similar sub-models.

3. The method of claim 2, wherein the human-readable interpretation is determined based on the similarity scores.

4. The method of claim 1, wherein the domain ontology is specific to a domain of the predictive model.

5. The method of claim 1, wherein each constraint of the one or more constraints comprises a constraint on a level of the domain ontology that can be used in the human-readable interpretation.

6. The method of claim 5, further comprising receiving one or more user-defined constraints for inclusion in the one or more constraints.

7. The method of claim 1, wherein the at least one semantic model meets each constraint of the one or more constraints.

8. The method of claim 1, wherein prior to providing the at least one semantic model, at least one invalid semantic model is determined, the at least one invalid semantic model violating at least one constraint of the one or more constraints.

9. The method of claim 8, further comprising iteratively repeating providing a semantic model until at least one constraint of the one or more constraints is satisfied.

10. A non-transitory computer-readable storage medium coupled to one or more processors and having instructions stored thereon which, when executed by the one or more processors, cause the one or more processors to perform operations for interpreting a computer-executed predictive model, the operations comprising:
    receiving current data;
    processing the current data using a predictive model to provide a result, the result corresponding to a sub-model of the predictive model;
    determining a set of syntactically similar sub-models based on data other than the current data, the set of syntactically similar sub-models being determined by syntactic matching between the current data and the data other than the current data based on the predictive model, syntactic matching comprising tracing multiple paths through the predictive model and syntactically matching a first trace provided based on the current data to a second trace provided based on at least a portion of the data other than the current data;
    providing at least one semantic model based on the sub-model of the predictive model, one or more syntactically similar sub-models of the set of syntactically similar sub-models, a domain ontology stored as a knowledge graph, and one or more constraints, the at least one semantic model being provided by merging nodes of the sub-model of the predictive model, and a previously determined sub-model of the predictive model using the domain ontology, a label of the domain ontology being used to label a merged node;
    determining a human-readable interpretation based on the at least one semantic model, the human-readable interpretation providing at least one reason for the result; and
    providing the human-readable interpretation for display on a display of a computing device.

11. The computer-readable storage medium of claim 10, wherein determining a set of syntactically similar sub-models comprises comparing nodes between the sub-model of the predictive model and each of one or more previously determined sub-models of the predictive model to provide respective similarity scores, at least one previously determined sub-model of the predictive model being included in the set of syntactically similar sub-models.

12. The computer-readable storage medium of claim 11, wherein the human-readable interpretation is determined based on the similarity scores.

13. The computer-readable storage medium of claim 10, wherein the domain ontology is specific to a domain of the predictive model.

14. The computer-readable storage medium of claim 10, wherein each constraint of the one or more constraints comprises a constraint on a level of the domain ontology that can be used in the human-readable interpretation.

15. The computer-readable storage medium of claim 14, wherein operations further comprise receiving one or more user-defined constraints for inclusion in the one or more constraints.

16. The computer-readable storage medium of claim 10, wherein the at least one semantic model meets each constraint of the one or more constraints.

17. The computer-readable storage medium of claim 10, wherein prior to providing the at least one semantic model, at least one invalid semantic model is determined, the at least one invalid semantic model violating at least one constraint of the one or more constraints.

18. The computer-readable storage medium of claim 17, wherein operations further comprise iteratively repeating providing a semantic model until at least one constraint of the one or more constraints is satisfied.

19. A system, comprising: one or more processors; and
a computer-readable storage device coupled to the one or more processors and having instructions stored thereon which, when executed by the one or more processors, cause the one or more processors to perform operations for interpreting a computer-executed predictive model, the operations comprising:
receiving current data;
processing the current data using a predictive model to provide a result, the result corresponding to a sub-model of the predictive model;
determining a set of syntactically similar sub-models based on data other than the current data, the set of syntactically similar sub-models being determined by syntactic matching between the current data and the data other than the current data based on the predictive model, syntactic matching comprising tracing multiple paths through the predictive model and syntactically matching a first trace provided based on the current data to a second trace provided based on at least a portion of the data other than the current data;
providing at least one semantic model based on the sub-model of the predictive model, one or more syntactically similar sub-models of the set of syntactically similar sub-models, a domain ontology stored as a knowledge graph, and one or more constraints, the at least one semantic model being provided by merging nodes of the sub-model of the predictive model, and a previously determined sub-model of the predictive model using the domain ontology, a label of the domain ontology being used to label a merged node;
determining a human-readable interpretation based on the at least one semantic model, the human-readable interpretation providing at least one reason for the result; and
providing the human-readable interpretation for display on a display of a computing device.

20. The system of claim 19, wherein determining a set of syntactically similar sub-models comprises comparing nodes between the sub-model of the predictive model and each of one or more previously determined sub-models of the predictive model to provide respective similarity scores, at least one previously determined sub-model of the predictive model being included in the set of syntactically similar sub-models.

21. The system of claim 20, wherein the human-readable interpretation is determined based on the similarity scores.

22. The system of claim 19, wherein the domain ontology is specific to a domain of the predictive model.

23. The system of claim 19, wherein each constraint of the one or more constraints comprises a constraint on a level of the domain ontology that can be used in the human-readable interpretation.

24. The system of claim 23, wherein operations further comprise receiving one or more user-defined constraints for inclusion in the one or more constraints.

25. The system of claim 19, wherein the at least one semantic model meets each constraint of the one or more constraints.

26. The system of claim 19, wherein prior to providing the at least one semantic model, at least one invalid semantic model is determined, the at least one invalid semantic model violating at least one constraint of the one or more constraints.

27. The system of claim 26, wherein operations further comprise iteratively repeating providing a semantic model until at least one constraint of the one or more constraints is satisfied.

* * * * *